United States Patent [19]
Oyama

[11] Patent Number: 5,358,621
[45] Date of Patent: Oct. 25, 1994

[54] METHOD OF MANUFACTURING SEMICONDUCTOR DEVICES

[75] Inventor: Yasuo Oyama, Tokyo, Japan

[73] Assignee: NEC Corporation, Tokyo, Japan

[21] Appl. No.: 975,096

[22] Filed: Nov. 12, 1992

[30] Foreign Application Priority Data

Dec. 10, 1991 [JP] Japan ................... 3-326073

[51] Int. Cl.⁵ .................... C25D 5/02; C25D 5/10
[52] U.S. Cl. ..................... 205/123; 437/189;
437/192; 437/190; 437/195; 204/192.17;
204/192.25
[58] Field of Search .............. 437/189, 192, 190, 195;
205/123, 124; 204/192.17, 192.25

[56] References Cited

U.S. PATENT DOCUMENTS 5,104,820 4/1992 Go et al. .................. 437/208

OTHER PUBLICATIONS

Haberle, et al., "Multilevel Gold Metallization" V-MIC Conf., Jun. 13-14, 1988, pp. 117-124.

Sumers, Doug, "A Process For Two-Layer Gold IC Metallization", *Solid State Technology*, Dec. 1983.

*Primary Examiner*—Kathryn Gorgos

[57] ABSTRACT

In a semiconductor device having multi-layer lead conductors, lead conductors of each layer and through connections are generated by electro chemical plating process. A flat and smooth surface is provided for each layer on which lead conductor base patterns are formed. Plating lead conductors on a layer and plating through connections are executed in a separate process. And, in these platings, electrolytic current is so controlled that the growth of plating is always from the base of the plating.

6 Claims, 5 Drawing Sheets

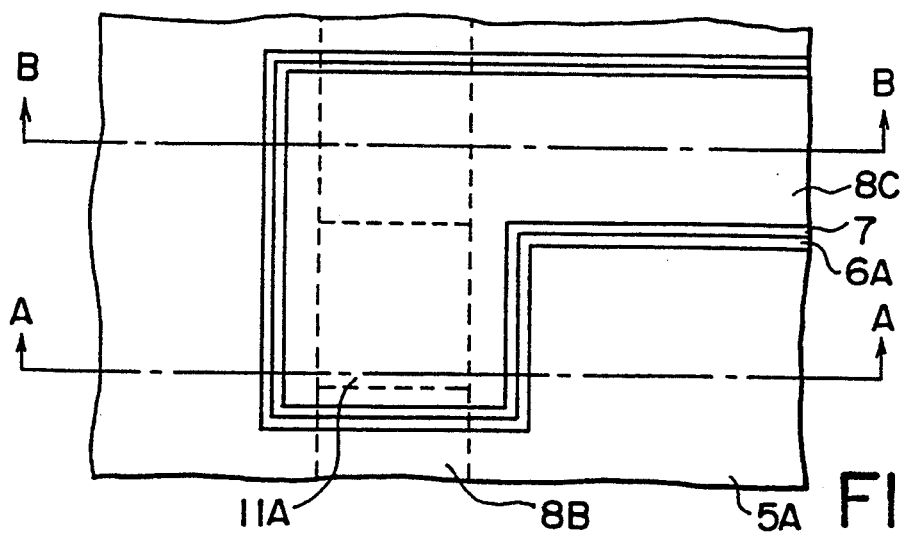
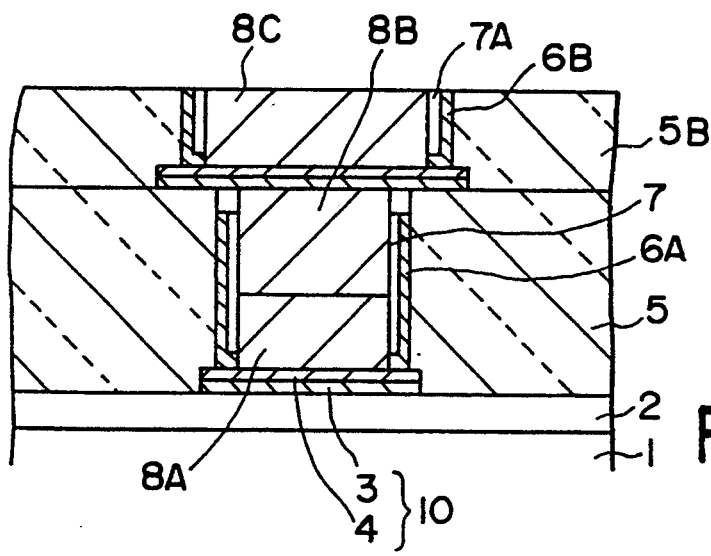
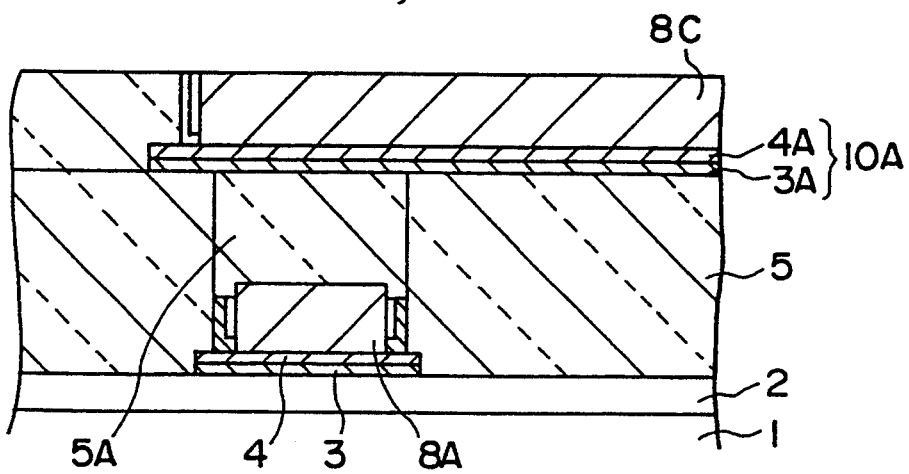

15A : PSI LAYER
15B : PSI LAYER
15C : PSI LAYER
18A : LOWER LAYER LEAD CONDUCTOR
18B : THROUGH CONNECTION
18C : UPPER LAYER LEAD CONDUCTOR

16 : Ti FILM
16A: Ti FILM

METHOD OF MANUFACTURING SEMICONDUCTOR DEVICES

BACKGROUND OF THE INVENTION

This invention relates to a method of manufacturing semiconductor devices, and more particularly semiconductor devices having multi-layer lead conductors formed by electro chemical plating process.

The prior art devices are disclosed, for example, on "Multilevel Gold Metallization" by K. Haberle et al in a paper of V-MIC Conf. Jun. 13–12, 1988, and on "A Process for Two-Layer Gold IC Metallization" by D. Summers in Solid State Technology/December 1983.

In a heretofore used method of manufacturing these semiconductor devices, (p-a) a silicon substrate is covered with an oxide film,
(p-b) a film of TiW is sputtered on the oxide film,
(p-c) a film of Au is sputtered on the TiW film,
(p-d) a photoresist pattern is formed on superimposed films of TiW and Au,
(p-e) Au is plated by electro chemical plating process on the lower conductor base pattern to form lower layer lead conductors, two films of TiW and Au being etched with the plated Au as the mask,
(p-f) silicon impregnated polyimide (PSI) as an insulating layer, is painted on the Whole surface of the substrate.
(p-g) Through holes for through connections are formed in the PSI layer, each through hole reaching a surface of the lower layer lead conductors,
(p-h) upper conductor base pattern of TiW film and Au film are formed on the surface of the PSI layer including side walls of the through holes,
(p-i) upper layer lead conductors and through connections are electro chemically plated on patterned TiW and Au films.

There are problems in semiconductor devices thus fabricated. A first problem is unevenness of the surface of PSI layer where upper conductor base patterns are formed. This unevenness is caused by a height of the lower layer lead conductors from the oxide film of the silicon substrate.

The surface of the PSI layer on the lower layer lead conductors naturally becomes higher than that on the oxide film. This unevenness of the PSI surface is accumulated with number of layers, and when this unevenness exceeds the focal depth of an optical instrument for exposure in patterning photoresist film, patterning is degraded and yield rate of the semiconductor devices is lowered.

A second problem is in the reliability of the through connections. In the above mentioned process of fabrication, electrochemical plating of a through connection grows from a bottom Au film and from a side-wall Au film. When the growth from the side-wall Au film is fast, the opening of the through hole becomes small by the growth of plating around the opening. This smallness of the opening clogs up electrolytic solution to enter in lower parts of the through hole. As a result, air holes (or an air hole) are included in the through connection. It is apparent that this air hole is a problem in reliability.

BRIEF DESCRIPTION OF THE INVENTION

Therefore, a primary object of the present invention is to provide a method of manufacturing semiconductor devices having smooth flat PSI surface for upper conductor base patterns and reliable through connections between lower layer lead conductors and upper layer lead conductors.

For this object, a first PSI layer is painted on lower conductor base patterns (not on lower layer lead conductors as described in (p-f) of the prior method). Openings are made in this first PSI layer to expose upside surfaces of the lower conductor base patterns to electrolyte. In order to prevent electrolytic current from flowing out from other parts than the upper surfaces of the lower conductor base patterns, lower layer lead conductors are plated on the lower conductor base patterns. On these lower layer lead conductors, through connections are plated. (Through connections are not plated together with upper layer lead conductors as described in (p-i) of the prior method).

In a first embodiment of this invention, a first PSI layer has a thickness which is equal to the sum of heights of lower layer lead conductors and through connections. After the lower layer lead conductors and through connections are plated, an intermediate PSI layer is painted on the whole surface filling the openings on lower layer lead conductors where there is no through connection. Then this intermediate PSI layer is etched to a depth at which upside surfaces of the through connections are exposed. On these etched surfaces, a second PSI layer having a thickness equal to the height of the upper lead conductors are painted.

In a second embodiment of this invention, thickness of a first PSI layer is made equal to the height of the lower layer lead conductors, and in this first PSI layer, lower layer lead conductors are formed. On this first PSI layer, a second PSI layer having thickness equal to a height of through connections are coated, and through connections are formed in this second PSI layer.

There are two modifications of means for preventing electrolytic current from going out into the electrolyte. In one modification, conductor surfaces are coated by insulating films, and in another modification, conductor surfaces are oxidized to make insulating films.

BRIEF DESCRIPTION OF THE DRAWINGS

Further objects, features, and advantages of this invention will become apparent from a consideration of the following description, and the accompanying drawings in which the same numerals indicate the same or the corresponding parts.

FIGS. 2(*a*) to 2(*c*) show a plan view and cross sectional views illustrating steps of manufacturing process after steps shown in FIG. 1.

DETAILED DESCRIPTION OF THE PREFERRED EMBODIMENTS

Figure 1A:
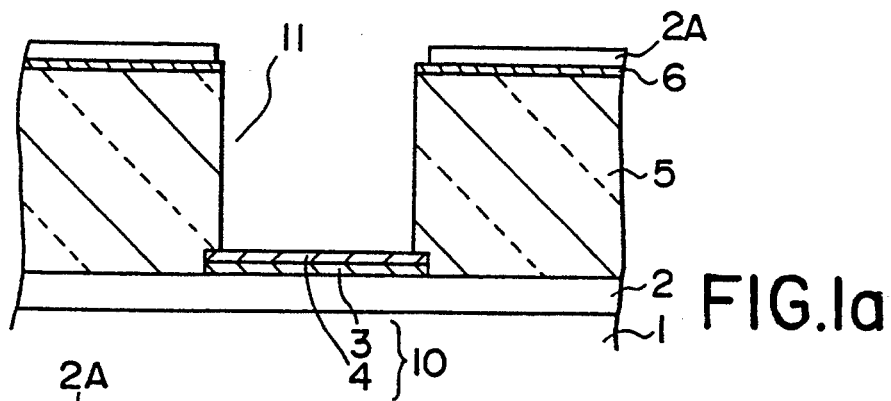
FIGS. 1(*a*) to 1(*d*) show cross sectional views of an embodiment of this invention, illustrating steps of manufacturing process for fabricating lower layer lead conductors and through connections.

Referring to FIG. 1 and FIG. 2, silicon substrate 1 is covered by an oxide film 2. On this oxide film 2, a TiW film 3 and an Au film 4 are sputtered. The superimposed two metal films 3, 4 are etched to form lower conductor base patterns 10. A PSI layer (called a first PSI layer when discriminated from other PSI layers) 5 is painted on the surface of the substrate 1. Openings 11 are made through the PSI layer 5 to reach the upside surfaces of the lower conductor base patterns 10.

Current delivering conductors comprising Ti films 6 and 6A are connected to the lower conductor base patterns 10. Exposed surfaces of these current delivering conductors 6, 6A are insulated by an oxide films 2A and 7. And on the lower conductor base patterns 10, lower layer lead conductors 8A are generated. Through connections 8B are formed at predetermined places on the lower layer lead conductors 8A. A through hole 11A is provided for each through connection 8B. These through holes 11A and through connections 8B are formed at places determined by a photoresist film 9.

The openings 11 where through connections 8B are not formed are filled with a PSI layer 5A (called an intermediate PSI layer when discriminated from other layers). The PSI layer 5A is etched to expose the surfaces of the PSI layer 5 and the through connections 8B. On the flat surface of the PSI layer 5, 8B and 5A, upper conductor base patterns 10A comprising TiW film 3A and Au film 4A are formed, and a PSI layer 5B is painted. The upper conductor base patterns 10A are connected to current delivering conductors comprising Ti film 6B, and upper layer lead conductors 8C are generated on the upper conductor base patterns 10A.

In a step of FIG. 1(a), TiW film 3 is sputtered to a thickness of 50 nm. This TiW film 3 closely adheres to the oxide film 2 and prevents reactions between the Au film 4 and the oxide film 2. On this TiW film 3, the Au film 4 which makes a base for electro chemical Au plating, is sputtered to a thickness of 50 nm. Then the Au film 4 and the TiW film 3 are patterned by a dry etching process to form a lower conductor base pattern 10.

Then, the whole surface of the substrate 1 including the surfaces of the lower conductor base patterns 10 is coated by the PSI layer 5 of a thickness of 1.5 μm which is equal to the sum of heights of lower layer lead conductors 8A and through connections 8B. On this PSI layer 5, a Ti film 6 of 50 nm and an oxide film 2A of 100 nm is formed by plasma enhanced CVD (chemical vapor deposition). And then the oxide film 2A and the Ti film 6 are etched by anisotropic etching method.

When necessary, the oxide film 2A is etched in a lateral direction for receding an edge of the oxide film 2A by an amount of about 50 nm from the periphery of the opening 11 which is formed in a later process.

Figure 1B:
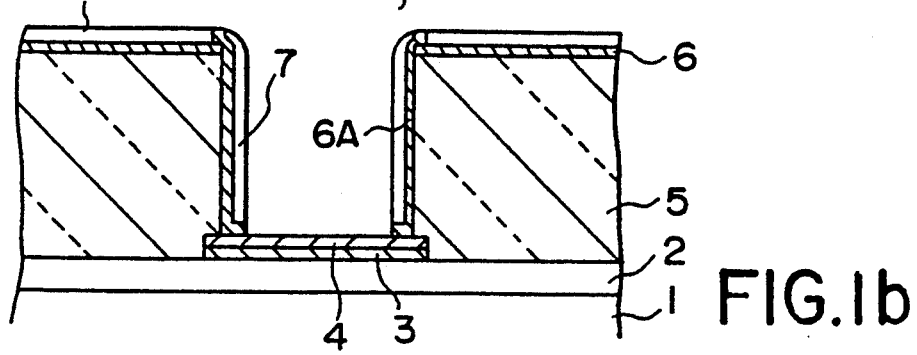

The purpose of this etching is to expose a part of the Ti film 6 around the opening 11 and to provide a reliable connection between the Ti film 6 and the Ti film 6A in FIG. 1(b). When this connection is made secure by other means, this etching process is eliminated.

In a final process of the step of FIG. 1(a), the PSI layer 5 is etched by a dry etching process where oxygen is a main component gas, to form openings 11.

In a step of FIG. 1(b), a Ti film 6A of 50 nm and an oxide film 7 are formed on the whole surface. By the process, the lower conductor base patterns 10 are connected to the Ti film 6 by the Ti film 6A. Then, the oxide film 7 is etched by a dry etching process where $CHF_3$ is an etching gas, leaving the oxide film 7 only on side walls of the openings 11. Then, the Ti film 6A is etched by 50 nm in an etching solution of anmonia and hydrogen peroxide as main components. Further, exposed surfaces of the Ti film 6A is oxidized in an atmosphere of oxygen at 400° C. for about five minutes to generate an insulating surface.

Figure 1C:
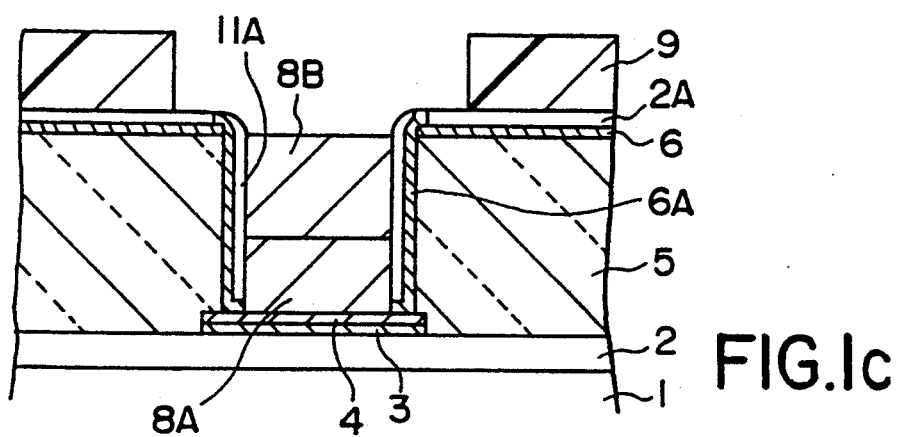

In a step of FIG. 1(c), the lower layer lead conductors 8A are generated by electro chemical plating on the lower conductor base patterns 10. In this plating process, electrolytic current flows from the Ti film 6 which is formed on the surface of the PSI layer 5 to any part of the lower conductor base patterns 10 with uniform density. The Au plating grows only on the lower conductor base patterns, since all other surfaces of current delivering conductors are insulated from the electrolyte solution.

Next, the photoresist film 9 is painted on the whole surface and patterned to expose through holes 11A on the lower layer lead conductors 8A. Then through connections 8B of thickness of 750 nm are generated in through holes 11A. After the through connections are completed, the photoresist film 9 is removed.

Figure 1D:
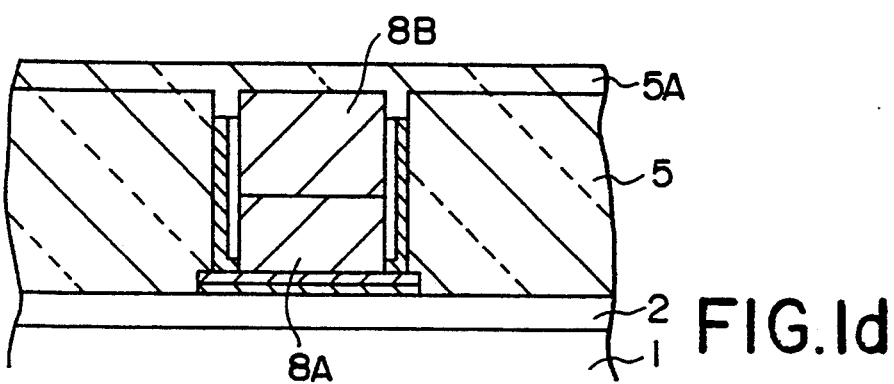

In a step of FIG. 1(d), the oxide film 2A and the Ti film 6 is etched by fluoric acid solution. In this etching process, the oxide film 7 and the Ti film 6A are so etched that the top surfaces of these films come about 200 nm below the top surface of the PSI layer 5. Next, an intermediate PSI layer 5A of about 100 nm thickness is formed on the whole surface. In this process, the lower layer lead conductors 8A are buried under the PSI layer 5A as shown by FIG. 2(c), where there is no through connections 8B.

In steps shown by FIG. 2, after the PSI layer 5A is etched to expose the top surfaces of the through connections 8B, the upper conductor base patterns 10A (comprising a TiW film 3A and an Au film 4A) are formed by a process similar to that described in connection with FIGS. 1(a)~1(c).

Next, the second PSI layer 5B of 750 nm thickness is formed, the openings are formed, and the upper layer lead conductors 8C are formed by Au plating in these openings. In this process, the top surfaces of the upper layer lead conductors 8C become flat with the top surface of the PSI layer 5B. After this process, the oxide film 2A and the Ti film 6 (not shown in FIG. 2, please refer to FIG. 1) on the PSI layer 5B are removed.

Figure 3:
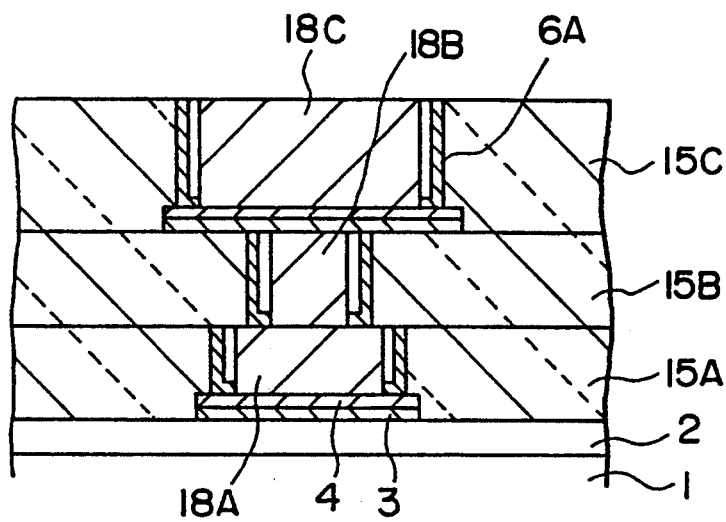
FIG. 3 shows a cross sectional view illustrating another embodiment of this invention.

In FIG. 3, which shows a second embodiment of this invention, a first PSI layer 15A has a thickness equal to the height of lower layer lead conductors 18A, a second PSI layer 15B has a thickness equal to the height of through connections 18B, and a third PSI layer 15C has a thickness equal to the height of upper layer lead conductors 18C.

In this embodiment, the thickness of the first PSI layer 15A is made equal to the height of the lower layer lead conductor 18A. The process for generating the lower layer lead conductors 18A is similar to that described in connection with FIGS. 1(a)~(c). The top surfaces of the lower layer lead conductors 18A becomes flat with that of the first PSI layer 15A.

The oxide film 2A and the Ti film 6 on the layer 15A (please refer to FIG. 1) are etched, also parts of the oxide film 7 and the Ti film 6A protruding from the top surface of the PSI layer 15A are etched to produce a flat top surface of 15A. The second PSI layer 15B of a thickness which is equal to the height of the through connections 18B is formed on the surface of 15A, and the through connections 18B are generated by electro chemical plating in the through holes. The Ti film and the oxide film which are above the top surface of the PSI layer 15B are etched to produce a flat top surface of 15B. In this process, conductor base patterns comprising a TiW film and an Au film are not necessary, because each through connection has a base on a surface of lower layer lead conductors 18A.

Repeating similar steps, the upper layer lead conductors 18C are formed.

In the second embodiment, since the electrochemical Au plating is generated to fill up the openings provided in the PSI layers, the evenness of the PSI surfaces becomes better than that in the first embodiment.

Figure 4A:
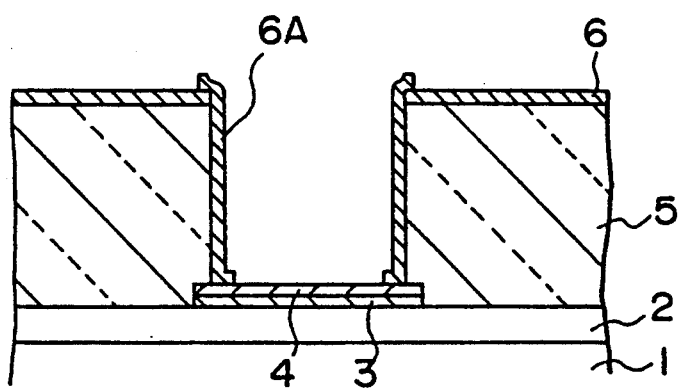
FIGS. 4(*a*) and 4(*b*) show cross sectional views illustrating a modification of this invention.

Referring to FIG. 4, after the oxide film 7 (please refer to FIG. 1) is etched, the whole surface of the Ti film 6A is heat treated to generate a thin insulating film in oxygen atmosphere of 400° C. for about 5 minutes. Electrolytic current does not go out from the surface of the Ti layer 6A as the surface has an insulating film.

Figure 4B:
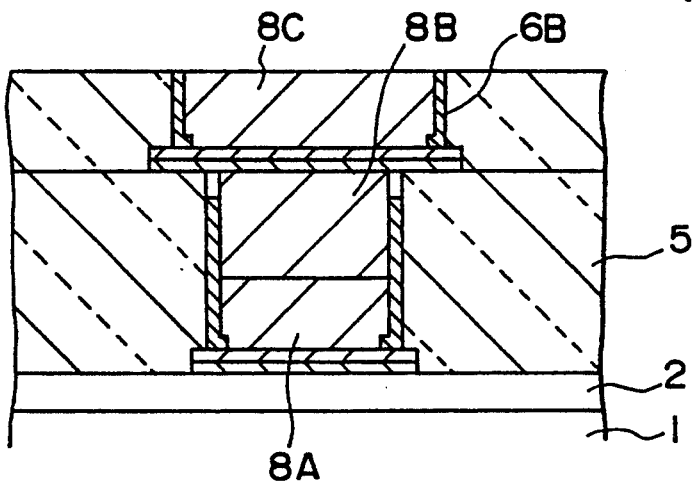

In this modification shown by FIG. 4(b), the oxide film 7 is eliminated. When the width of the opening 11 is 1.5 $\mu$m, the thickness of the Ti film 6A is 50 nm, and the thickness of the oxide film 7 is 50 nm, the width of the lower layer lead conductors 8A in FIG. 4(b) is 1.4 $\mu$m, while that in FIG. 1(c) is 1.3 $\mu$m.

Figure 5:
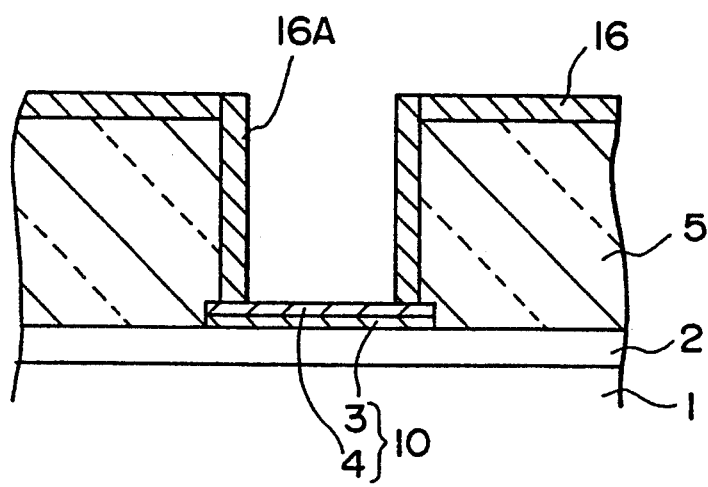
FIG. 5 shows a cross sectional view illustrating another modification of this invention.

FIG. 5 shows another modification of this invention, and in FIG. 5, the current delivering conductors comprises a Ti film 16 and a Ti film 16A. These Ti film 16 and 16A have a thickness of 150 nm. The surface of these films are oxidized or nitrided to generate a surface insulating film. In this modification, the process of coating the oxide film 2A and the process of coating the oxide film 7 can be eliminated, substantially simplifying manufacturing processes.

In heretofore described embodiments, number of layers are 2 (two). But, since a flat and smooth surface is provided for each layer by the method of this invention, it is apparent that this invention is not limited by the number of layers.

I claim:

1. A method of manufacturing a semiconductor device, comprising the steps of:
    forming at least one conductive base layer on a first insulating film covering a semiconductor substrate;
    forming a second insulating film to cover said at least one conductive base layer and said first insulating film;
    selectively forming an opening in said second insulating film to expose a part of said at least one conductive base layer, said second insulating film having a sidewall surface defining said opening;
    forming a current delivering conductor on said sidewall surface of said second insulating film and said part of said at least one conductive base layer, said current delivering conductor having a first portion formed in contact with said sidewall surface of said second insulating film and a second portion formed in contact with said part of said at least one conductive base layer;
    covering said current delivering conductor with a third insulating film, said third insulating film having third and fourth portions covering said first and second portions of said current delivering conductor, respectively;
    removing respective parts of said fourth portion of said third insulating film and said second portion of said current delivering conductor to expose a portion of said part of said at least one conductive base layer with leaving a remaining part of said second portion of said current delivering conductor in contact with a remaining portion of said part of at least one conductive base layer; and
    plating a metal by supplying a current through said current delivering conductor to said at least one conductive base layer so that said metal is grown only from said portion of said part of said at least one conductive base layer and preventing said metal from being grown from said first portion and said remaining part of said second portion of said current delivering conductor by said third insulating film.

2. The method as claimed in claim 1, wherein said at least one conductive base layer is composed of a first conductive layer made of a TiW layer and a second conductive layer formed on said first conductive layer and made of an Au layer, said metal being Au.

3. A method of manufacturing a semiconductor device, comprising the steps of:
    forming at least one conductive base layer on a first insulating layer covering a semiconductor substrate;
    forming a second insulating film to cover said at least one conductive base layer and said first insulating film;
    removing a portion of said second insulating film along said at least one conductive base layer to form a first opening exposing a part of said at least one conductive base layer along said at least one conductive base layer;
    forming a current delivering conductor which is in contact with said part of said at least one conductive base layer and is elongated over a surface of said second insulating film through said first opening;
    covering said current conductive base layer with a third insulating film;
    removing respective parts of said third insulating film and said current delivering conductor to expose only one portion of said part of at least one conductive base layer;
    plating a first metal by supplying a current through said current delivering conductor to said at least one conductive base layer so that said first metal is grown only from said one portion of said part of said at least one conductive base layer up to such a height that said first metal does not fill said first opening completely;
    forming a fourth insulating film on said first metal to fill said first opening;
    removing a part of said fourth insulating film to form a second opening exposing a portion of said first metal with leaving a remaining part of said first metal covered with said fourth insulating film; and
    plating a second metal by supplying a current through said current delivering conductor and said at least one conductive base layer to said first metal so that said second metal is grown only from said portion of said first metal to fill said second opening.

4. The method as claimed in claim 3, further comprising the step of forming a conductive film in contact with said second metal so that said conductive film is elongated over said fourth insulating film.

5. The method as claimed in claim 4, wherein each of said first and second metals is gold and said at least one conductive base layer is composed of a TiW layer and a gold layer formed on said TiW layer.

6. The method as claimed in claim 5, wherein said current delivering conductor is made of Ti.

* * * * *